(12) United States Patent
Wen

(10) Patent No.: US 7,276,458 B2
(45) Date of Patent: Oct. 2, 2007

(54) ANTI-BALLISTIC FABRIC OR OTHER SUBSTRATE

(75) Inventor: Sheree H. Wen, 796 Longhill Rd. West, Briarcliff Manor, NY (US) 10510

(73) Assignee: Sheree H. Wen, Hawthorne, NY (US)

( * ) Notice: Subject to any disclaimer, the term of this patent is extended or adjusted under 35 U.S.C. 154(b) by 0 days.

(21) Appl. No.: 10/352,148

(22) Filed: Jan. 27, 2003

(65) Prior Publication Data

US 2004/0147191 A1  Jul. 29, 2004

(51) Int. Cl.
*B32B 5/02* (2006.01)
*B32B 27/12* (2006.01)
*D03D 15/00* (2006.01)
*F41H 1/02* (2006.01)

(52) U.S. Cl. ............... 442/135; 442/134; 442/169; 442/301; 428/902; 428/911; 2/2.5

(58) Field of Classification Search ............... 442/134, 442/135, 169, 301; 428/902, 911; 2/2.5
See application file for complete search history.

(56) References Cited

U.S. PATENT DOCUMENTS 3,871,026 A * 3/1975 Dorre ............................ 2/410
5,880,042 A * 3/1999 Schuster et al. ............... 442/59
6,656,570 B1 * 12/2003 Fels et al. ..................... 428/155

FOREIGN PATENT DOCUMENTS

WO  WO 9845662 A1 * 10/1998

OTHER PUBLICATIONS

WO 96/03277 Schuster et al. Feb. 8, 1996 (English Abstract).*
WO 99/37969 Fels et al. Jul. 29, 1999 (English Abstract).*

* cited by examiner

*Primary Examiner*—Jenna Befumo
(74) *Attorney, Agent, or Firm*—Robert D. Katz, Esq.; Copper & Dunham LLP

(57) ABSTRACT

The invention provides a composite textile or material comprising a substrate of high strength fibers, and having a natural or synthetic diamond coating bonded thereto. Preferably, the textile is a high strength fabric including or made from aramide fibers, and the natural or synthetic coating is applied by a process such as plasma or flame spraying, chemical vapor deposition, sintering, or fast pulse laser deposition. The textile or fabric can preferably be used to make or reinforce protective clothing including vests, hats, helmets, jackets, pants, shoes or boots, coats, blankets, rugs, curtains, and the like. The textile or fabric may also include an iodine or iodine containing coating, to absorb radioactive radiation, and to kill airborne pathogens, including bacteria and viruses.

10 Claims, No Drawings

ANTI-BALLISTIC FABRIC OR OTHER SUBSTRATE

FIELD OF THE INVENTION

This invention relates to improved coatings to use to make fabrics, cloths and other materials, including blankets, clothing, tents or carpets, highly resistant to abrasion, shrapnel, explosive blasts, sharp objects, and impact from bullets, other ballistics, or projectiles. More particularly, the invention relates to a high strength fabric or material having a natural or synthetic diamond particle coating applied thereon.

BACKGROUND OF THE INVENTION

Military personnel, police, security agents, detectives, bomb squads, and other persons involved in occupations presenting a risk of injury from gunshots, explosions, shrapnel, stabbing and impact from projectiles or other munitions have worn various types of vests or other protective garments. Such garments may be made from a high strength fiber reinforced or woven fabric or material, including, for example, aramide or similar extremely strong fibers, which resist penetration by knives, bullets, blades, and explosive forces or projectiles. Such fabrics or materials are discussed in U.S. Pat. No. 5,776,838 (Dellinger), U.S. Pat. No. 5,788,907 (Brown), U.S. Pat. No. 6,219,842 (Bachner), and U.S. Pat. No. 6,127,291 (Coppage), which are sold under several trade names, including Kevlar. The foregoing patents, and those discussed throughout this application are hereby are incorporated herein by reference.

As noted in one or more of the foregoing patents, the fabrics or garments include one or more layers of a high strength woven polymer oriented in one or more directions in the fabric. Multiple layers reinforce the strength of the fabric or the vest or other garment into which it is manufactured.

Some patentees incorporate one or more aramide layers into different portions of the garment, such as a vest, in order to add protection against more powerful projectiles. For example, U.S. Pat. No. 5,880,042 (Schuster) discusses protective clothing having multiple layers of flat textile structures, in which one side of one or more layers has a ceramic coating applied by plasma spraying. The layers may be woven fabrics made from aramide fibers. According to the patentees, however, a ceramic coating thickness of up to about 100μ, and preferably 20-40μ should be applied, resulting in a coating having substantial weight per unit area. A protective garment, according to this patentee, may include 25 inner layers of an aramide fiber woven fabric with a ceramic coating applied by plasma spraying, and about 10 outer layers of aramide fabric lacking a ceramic coating. The fabric may weigh more than 200 g/m$^2$, which would make it bulky, stiff, heavy and uncomfortable for many law enforcement, military, or other protective uses.

It is therefore an object to provide an improved, lighter weight fabric which repels bullets, projectiles, shrapnel, and cuts and slashes.

SUMMARY OF THE INVENTION

The disadvantages of the foregoing references can be overcome, and the objects of the invention can be achieved by providing an improved projectile resistant fabric or textile that weighs significantly less than currently available materials, without sacrificing accompanying strength or projectile resistance capabilities. The invention comprises in a broad sense, a composite textile or material comprising a substrate of high strength fibers, and having a natural or synthetic diamond coating bonded thereto. Preferably, the textile is a high strength fabric including or made from aramide fibers, and the natural or synthetic coating is applied by a process such as plasma or flame spraying, chemical vapor deposition, sintering, or fast pulse laser deposition. The textile or fabric can preferably be used to make or reinforce protective clothing including vests, hats, helmets, jackets, pants, shoes or boots, coats, blankets, rugs, curtains, and the like. The textile or fabric may also include an iodine or iodine containing or releasing coating, to absorb radioactive radiation, and to kill airborne pathogens, including bacteria and viruses.

The invention also provides a protective article, such as a garment or article of clothing comprising a fabric substrate including high strength fibers, and a coating made from synthetic or natural diamond particles, and bonded or adhering to the substrate. The diamond particles may be applied by one of a variety of methods suitable for application of a layer of particles on a surface. The methods include plasma or flame spraying, chemical vapor deposition (CVD), a sintering process or a pulsed laser assisted process, for example, in which short high intensity pulses or bursts of laser light help to affix one or more layers or matrices of diamond micrograms to the fabric substrate.

The invention also provides, in another preferred embodiment, a method for making a ballistic resistant textile or material, by providing a substrate made from high strength fibers, such as aramide or polyaramide fibers, high strength extended include extended chain polyethylene filament, extended chain polypropylene filament, polyvinyl alcohol filament, polyacrylonitrile filament, liquid crystal filament, glass filament, carbon filament, and mixtures thereof, and then adhering thereto a coating made from synthetic or natural diamond particles, such as one or more layers or matrices of natural or synthetic diamond micrograms.

DETAILED DESCRIPTION OF THE PREFERRED EMBODIMENTS

The present invention provides a diamond or diamond-like coating or layer on a fabric or other substrate for use in protecting an individual against harm from explosions, projectiles, shrapnel, and the like. The diamond or diamond-like layer may be preferably applied by one of several methods, although more than one process may be used, where desirable. The application process for carrying out the present invention may include a plasma or flame spraying process, an ion beam vapor deposition process, a chemical vapor deposition process, a sintering process, or a short pulse laser process to affix micrograms or particles of diamond or diamond-like material to the substrate. In addition, a diamond or diamond-like layer may be grown directly on the fabric or substrate base layer using crystal growing techniques. The layer either adheres from the heat generated by the process, as in the plasma spraying or pulsed laser methods. Alternatively, the particles adhere as part of the crystal growth process, or by use of an adhesive suitable for adhering the diamond or diamond-like coating to the substrate. A person of ordinary skill would be able to select a suitable adhesive or intermediate layer to form a bond between the underlying substrate and the diamond coating, which has the desired degree of adherence.

Where the coating is applied by plasma or flame spraying, the coating may be applied, for example, in accordance with the disclosure of U.S. Pat. No. 5,635,254 (Holcombe), the entire contents of which is incorporated herein by reference. Briefly, particles of a glassy carbon substance are rapidly heated by propelling them through a direct current plasma arc in an inert atmosphere, such as argon gas or the like, so that the glassy carbon substance exceeds its softening point. The softened particles or micrograins hit the fabric substrate, deforming slightly due to their softened or molten exteriors, allowing a layer to build up and harden to form a layer on the substrate. The layer gradually builds to the desired thickness as the operator moves the plasma spray gun or similar device to cover the substrate. Preferably, the thickness of the artificial or synthetic diamond or diamond-like surface should be about 10μ to about 100 μm, depending on how the finished material will be used. For bulletproof vests, for example, a thickness of about 20 to 40μ appears desirable. Protectiveness can be increased by increasing the thickness of the diamond material layer, or by providing several layers of fabric or other substrate coated with diamond material. The diamond-like layer has low expansivity when heated, a low coefficient of friction, and a high degree of hardness and heat conductivity. A rather thin film therefore provides protection against gun shots, stabbings, shrapnel, and other implements and objects which may otherwise injure wearer of the protective garment. The glassy or vitreous carbon should preferably be applied by plasma spraying, or other technique which provides an even layer of diamond or diamond-like material.

Plasma spraying is a thermal spraying process. Included under this collective term are voltaic arc spraying, flame spraying, atmospheric plasma spraying and vacuum plasma jet-spraying. For the protective clothing, garments and fabrics of this invention, other methods of thermal spraying besides atmospheric spraying can be used, particularly vacuum plasma spraying. However, atmospheric plasma spraying, henceforth referred to as "plasma spraying," is the preferable alternative for the invention. U.S. Pat. No. 5,880, 042 (Schuster) and U.S. Pat. No. 6,099,976 (Lemelson) provide description of how to apply diamond, diamond-like carbon, or diamond-like hydrocarbon layers to substrates by plasma spraying and other known deposition techniques. If the heat of the diamond-like particles adversely affects the fabric or substrate, the substrate can be kept cool by applying a heat absorbing fluid to the reverse of the side of the substrate being coated with diamond material.

Suitable CVD processes generally use thermal decomposition of a mixture of hydrogen and carbon compounds, preferably hydrocarbons, into diamond generating carbon atoms. Preferably, these carbon atoms get deposited from the gas phase and are activated in such a way as to avoid substantially the deposition of carbon graphite. The specific types of carbon compounds useful for CVD include C1-C4 saturated hydrocarbons such as methane, ethane, propane and butane; C1-C4 unsaturated hydrocarbons such as acetylene, ethylene, propylene and butylene; gases containing C and O, such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (see U.S. Pat. No. 4,816,286). The concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or a layer-like agglomerates of crystallites substantially free from intercrystalline adhesion binder.

The diamond particle layer may also be affixed by applying the diamond-like particles to the substrate in a layer of desired thickness using a conventional binder, and then annealing the particles to the substrate and to adjacent particles using short, high intensity, laser pulses, such as may be obtained from nanosecond ($10^{-9}$), picosecond ($10^{-12}$), or femtosecond ($10^{-14}$) laser pulses. Again, it may be necessary to cool the substrate on the reverse side using a cooling fluid to avoid its overheating.

In addition, the particles may be sintered onto the substrate by mixing them with a binder, applying the binder-particle mixture to the substrate and applying heat to the coating (either locally or to the coating as a whole) until the particles fuse to one another and to the substrate, at a sufficient temperature to create the diamond layer without harming the substrate, as will be appreciated by a person of ordinary skill.

The fabric or substrate used should preferably include high strength fibers woven together or high strength fibers woven with other such fibers or with a strong nylon or other synthetic material. High strength fibers refer to any fiber having a modulus greater than or equal to 150 grams/denier and tenacity greater than or equal to 6 grams/denier. High strength fibers include extended chain polyethylene filament, extended chain polypropylene, filament, polyvinyl alcohol filament, polyacrylonitrile filament, liquid crystal filament, glass filament, carbon filament, and mixtures thereof. Further information about these high strength fibers may be found in PCT Publication WO94/09336, which is incorporated herein by reference. High strength fibers are commercially available under the following trade names: VECTRAN, TREVAR, and CERTRAN from Hoechst Celanese Corporation of Charlotte, N.C.; KEVLAR from duPont of Wilmington, Del.; SPECTRA from AlliedSignal Corporation of Petersburg, Va.; DYMEMMA from DSM Corporation of Heerlen, The Netherlands; TWARON from Akzo Nobel of Arnhem, The Netherlands; and TECHNORA from Osaka and Tokyo, Japan.

Other fabrics, whether independently resistant to ballistics or not, may be used as a substrate, depending on the desired article. The substrate may even go beyond ballistic-resistant fabric and other articles of clothing, and include a diamond-like finish on automobile glass or glass or plastic containers to protect against shrapnel, explosions, clubs and other applications, where it would be desirable to prevent penetration by a blunt or sharp object, including ballistic projectiles shot from firearms.

The diamond-like layers may be applied to one or both faces of the substrate. There may be one layer or more than one layer of coating on a particular face of the substrate. There also may be one layer of coated substrate or more than one coated layer of substrate. As discussed above, the thickness of the coating may be varied in accordance with the intended use.

In another important embodiment, the fabric or material may also include a coating of iodine ($I_2$), or an iodine containing or releasing compound, such as polyvinylpyrolodone-iodine (PVP—$I_2$). The iodine coating or layer preferably is the outermost layer, i.e., is exposed to the atmosphere. It can serve a dual function: 1) it can absorb radioactivity from a "dirty" radioactive explosive device, such as a bomb having a radioactive outer shell, or even a nuclear weapon; and 2) it can serve as an antiseptic barrier to kill airborne pathogens, including bacteria and viruses, with which a wearer comes in contact. The iodine layer can be applied by spraying a solution of iodine or an iodine containing polymer solution having one or more volatile solvents. The amount of iodine applied can be adjusted according to the purpose for its application, and can be reapplied if it sublimates through exposure to air.

Many modifications to the foregoing embodiments discussed above will be apparent to those of ordinary skill in the art, but it should be appreciated that such variations are intended to be within the scope of the present invention as covered by the following claims.

I claim:

1. A composite textile or fabric comprising:
   at least one ballistic resistant woven substrate including a plurality of high strength fibers; and
   at least one layer of natural or synthetic diamond particles applied and bonded to the substrate by plasma or flame spraying, ion beam vapor deposition, chemical vapor deposition, sintering, pulse laser deposition, or a crystal growing or adhering process, and wherein the composite textile or fabric additionally comprises an iodine layer or iodine containing coating.

2. A composite textile or fabric as set forth in claim 1, wherein the high strength fibers are aramide fibers.

3. An article of protective clothing, comprising: one or more layers of a composite textile or fabric comprising at least one ballistic resistant woven substrate including a plurality of high strength fibers; and at least one layer of natural or synthetic diamond particles applied and bonded to the substrate by plasma or flame spraying, ion beam vapor deposition, chemical vapor deposition, sintering, pulse laser deposition, or a crystal growing or adhering process and wherein the composite textile or fabric additionally comprises an iodine layer or an iodine containing coating.

4. An article of protective clothing in accordance with claim 3, wherein the high strength fibers in the composite textile or fabric comprise aramide fibers.

5. An article of protective clothing according to claim 3, wherein the article is a bulletproof vest.

6. An article of protective clothing according to claim 4, wherein the article is a bulletproof vest.

7. An article of protective clothing according to claim 5, wherein the iodine layer or iodine containing or releasing coating absorbs radioactivity and provides an antiseptic barrier.

8. An article of protective clothing according to claim 6, wherein the iodine layer or iodine containing or releasing coating absorbs radioactivity and provides an antiseptic barrier.

9. An article of protective clothing according to claim 7, wherein the iodine layer or iodine containing or releasing coating may be reapplied.

10. An article of protective clothing according to claim 8, wherein the iodine layer or iodine containing or releasing coating may be reapplied.

\* \* \* \* \*